(12) United States Patent
Yang et al.

(10) Patent No.: US 10,041,170 B2
(45) Date of Patent: Aug. 7, 2018

(54) DUMMY WAFER, THIN-FILM FORMING METHOD, AND METHOD OF FABRICATING A SEMICONDUCTOR DEVICE USING THE SAME

(71) Applicant: Samsung Electronics Co., Ltd., Suwon-si, Gyeonggi-do (KR)

(72) Inventors: Cheolkyu Yang, Suwon-si (KR); Young-Jin Noh, Suwon-si (KR); Chulyoung Jang, Hwaseong-si (KR); Joongyun Ra, Seoul (KR); Dong-min Son, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 5 days.

(21) Appl. No.: 15/228,368

(22) Filed: Aug. 4, 2016

(65) Prior Publication Data

US 2017/0084452 A1 Mar. 23, 2017

(30) Foreign Application Priority Data

Sep. 21, 2015 (KR) .......................... 10-2015-0133111

(51) Int. Cl.
*H01L 21/02* (2006.01)
*C23C 16/44* (2006.01)
*H01L 27/11582* (2017.01)

(52) U.S. Cl.
CPC .......... *C23C 16/44* (2013.01); *H01L 21/0242* (2013.01); *H01L 21/02532* (2013.01); *H01L 27/11582* (2013.01)

(58) Field of Classification Search
CPC ............... H01L 21/02; H01L 21/02271; H01L 27/11582; H01L 27/01; H01L 23/28; H01L 23/485; H01L 23/4985
USPC .......................................................... 438/765
See application file for complete search history.

(56) References Cited

U.S. PATENT DOCUMENTS

| | | | |
|---|---|---|---|
| 5,938,852 A | 8/1999 | Nam et al. |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,785,303 B2 | 7/2014 | Liao |
| 8,809,206 B2 | 8/2014 | Sugino et al. |

(Continued)

FOREIGN PATENT DOCUMENTS

| JP | 2012069738 A | 4/2012 |
|---|---|---|
| KR | 100536586 B1 | 12/2005 |

(Continued)

*Primary Examiner* — Chuong A Luu
(74) *Attorney, Agent, or Firm* — Harness, Dickey & Pierce, P.L.C.

(57) ABSTRACT

Provided are a dummy wafer, a thin-film forming method, and a method of fabricating a semiconductor device using the same. The dummy wafer includes an insulating substrate with a first surface opposite a second surface, and a plurality of openings formed in the insulating substrate. The plurality of openings penetrate at least a portion of the insulating substrate in a direction from the first surface toward the second surface. The first and second surfaces of the insulating substrate, and an inner surface of each of the plurality of openings, include protrusions.

15 Claims, 19 Drawing Sheets

(56) References Cited

U.S. PATENT DOCUMENTS

| | | | |
|---|---|---|---|
| 2002/0159010 A1* | 10/2002 | Maeda | G02B 5/08 |
| | | | 349/113 |
| 2003/0209813 A1* | 11/2003 | Azuma | H01L 21/4853 |
| | | | 257/797 |
| 2009/0263976 A1 | 10/2009 | Yamamoto et al. | |
| 2009/0298220 A1* | 12/2009 | Anderson | H01L 27/14636 |
| | | | 438/70 |
| 2011/0233648 A1 | 9/2011 | Seol et al. | |
| 2012/0085278 A1 | 4/2012 | Moslehi et al. | |
| 2012/0202355 A1 | 8/2012 | Sugino et al. | |
| 2013/0323914 A1 | 12/2013 | Liao | |
| 2015/0093896 A1* | 4/2015 | Lee | H01L 21/76898 |
| | | | 438/667 |
| 2016/0315047 A1* | 10/2016 | Uzoh | H01L 23/5223 |
| 2016/0353584 A1* | 12/2016 | Honda | H05K 3/423 |

FOREIGN PATENT DOCUMENTS

| | | |
|---|---|---|
| KR | 20060038304 A | 5/2006 |
| KR | 20090097007 A | 9/2009 |

* cited by examiner

DUMMY WAFER, THIN-FILM FORMING METHOD, AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2015-0133111, filed on Sep. 21, 2015, in the Korean Intellectual Property Office, the entire contents of which are hereby incorporated by reference.

BACKGROUND

The present disclosure relates to a dummy wafer, a thin-film forming method, and a method of fabricating a semiconductor device using the same, and in particular, to a dummy wafer with a patterned structure, a thin-film forming method using the same, and a method of fabricating a semiconductor device using the same.

In general, a semiconductor device is fabricated by performing several processes (such as, a film forming process, a photolithography process, an etching process, an oxidation process, a diffusion process, and a sawing process) on a wafer. For example, during the film forming process, an oxide layer, a nitride layer, and/or a poly-silicon layer may be formed on a surface of the wafer.

A thin-film forming system may be used to perform the film forming process. A thin-film forming system may include a boat, on which a plurality of wafers are loaded, and a chamber. The chamber may be configured to provide physical environment suitable for processing the wafers loaded on the boat. Different techniques may be used to control the physical environment at top and bottom regions of the boat. For example, dummy wafers may be disposed at the top and bottom regions of the boat. By using the dummy wafer, it is possible to limit and/or protect wafers against undesired damage and to realize a more uniform physical environment for processing the wafers.

Meanwhile, with increase in a size of wafer increases, a design rule of a semiconductor device is being reduced to realize improvement of productivity and reduction of power consumption, and thus, an integration density of a semiconductor device is being increased. In other words, there is an increasing demand for semiconductor devices with a small unit cell area and a small pattern width. To meet such a demand, it is desirable to reduce a thickness of a film and improve uniformity in thickness of the film.

SUMMARY

Example embodiments of inventive concepts provide a dummy wafer, which is configured to have an increased surface area and can be fabricated with low cost.

Example embodiments of inventive concepts provide a method of forming a thin film with improved thickness uniformity.

According to example embodiments of inventive concepts, a dummy wafer may include an insulating substrate including a first surface opposite a second surface facing. The insulating substrate may include a plurality of openings penetrating at least a portion of the insulating substrate in a direction from the first surface toward the second surface. The first and second surfaces of the insulating substrate, and an inner surface of each of the plurality of openings, may include protrusions.

In example embodiments, the protrusions may be island-shape structures and the protrusions may be formed in an irregular manner.

In example embodiments, the plurality of openings may have a hole shape.

In example embodiments, the plurality of openings may be arranged along first and second directions crossing each other such that the plurality of openings may be arranged in rows and columns.

In example embodiments, the plurality of openings may include a first column of openings and a second column of openings. The first and second columns of openings may be arranged in the second direction. The second column of openings may be adjacent to the first column of openings. The openings in the first and second columns may be arranged to form a zigzag arrangement.

In example embodiments, the plurality of openings may have a diameter ranging from 0.3 mm to 1 mm.

In example embodiments, the plurality of openings may be open holes that are formed to penetrate the insulating substrate from the first surface to the second surface.

In example embodiments, the plurality of openings may have a trench shape.

In example embodiments, the plurality of openings may extend in a first direction and may be spaced apart from each other in a second direction crossing the first direction.

In example embodiments, the plurality of openings may include first openings and second openings. The first openings may extend in a first direction and may be spaced apart from each other in a second direction crossing the first direction. The second openings may extend in the second direction and may be spaced apart from each other in the first direction. The first openings and the second openings may intersect with each other.

In example embodiments, the plurality of openings may have a width ranging from 0.3 mm to 5 mm, and the plurality of openings may have a depth that is greater than 0.3 mm and is smaller than half a thickness of the insulating substrate.

In example embodiments, the thickness of the insulating substrate may range from 1 mm to 5 mm.

In example embodiments, the insulating substrate may include quartz.

According to example embodiments of inventive concepts, a thin-film forming method may include loading wafers in a process chamber and performing a process for forming thin films on the wafers. The wafers may be stacked in a boat. The wafers may include at least one product wafer on which a preceding process has been performed. The wafers may include a plurality of dummy wafers. Each of the dummy wafers may include an insulating substrate with a first surface opposite a second surface. The insulating substrate may include a plurality of openings formed in the insulating substrate and penetrating at least a portion of the insulating substrate in a direction from the first surface toward the second surface. The first and second surfaces of the insulating substrate, and an inner surface of each of the plurality of openings, may include protrusions. The process chamber may be configured to perform the process for forming the thin films on the wafers when the wafers are stacked in the boat in the process chamber. The performing the process for forming the thin films on the wafers may include heating the process chamber to a process temperature using a heating member, and supplying a process gas into the process chamber.

In example embodiments, some of the plurality of dummy wafers may be in an upper region of the boat, the others of the plurality of dummy wafers may be in a lower region of the boat, and the at least one product wafer may be in the boat between the upper and lower regions of the boat.

In example embodiments, the supplying the process gas into the process chamber may include supplying the process gas through an injection nozzle extending in a vertical direction parallel to the boat.

In example embodiments, the method may further include discharging at least one of an unreacted part of the process gas and by-product gas from the process chamber through an exhaust port, after the supplying of the process gas into the process chamber. The exhaust port may be provided in a sidewall of the process chamber such that the exhaust port may be adjacent to the lower region of the boat, when the process is performed.

In example embodiments, when viewed in a sectional view, the protrusions may include convex portions and concave portions, and at least one of a height of the convex portions and a distance between the convex portions may be irregular.

In example embodiments, the plurality of openings may be formed to have a hole shape.

In example embodiments, the plurality of openings may be formed along first and second directions crossing each other such that the plurality of openings may be arranged in a plurality of rows and a plurality of columns.

In example embodiments, the plurality of openings may be formed to have a diameter ranging from 0.3 mm to 1 mm.

In example embodiments, the plurality of openings may be open holes that are formed to penetrate the insulating substrate from the first surface to the second surface.

In example embodiments, the plurality of openings may be formed to have a trench shape.

In example embodiments, the plurality of openings may extend in a first direction and may be spaced apart from each other in a second direction crossing the first direction.

In example embodiments, the plurality of openings may include first openings and second openings. The first openings may extend in a first direction and may be spaced apart from each other in a second direction crossing the first direction. The second openings may extend in the second direction and may be spaced apart from each other in the first direction. The first openings and the second openings may intersect with each other.

In example embodiments, the plurality of openings may be formed to have a width ranging from 0.3 mm to 5 mm and a depth that is greater than 0.3 mm and is smaller than half a thickness of the insulating substrate.

In example embodiments, the thickness of the insulating substrate may range from 1 mm to 5 mm.

In example embodiments, the insulating substrate may have a thickness that is greater than that of a semiconductor substrate serving as the product wafer.

In example embodiments, the insulating substrate may be formed of the same material as the boat.

In example embodiments, the insulating substrate may include quartz.

According to example embodiments of inventive concepts, a method of fabricating a semiconductor device may include forming a layered structure on a semiconductor substrate, the layered structure including sacrificial layers and insulating layers that are alternatingly and repeatedly stacked on the semiconductor substrate; forming a channel hole to penetrate the layered structure and expose the semiconductor substrate; and sequentially forming a vertical insulating layer and a semiconductor layer on an inner surface of the channel hole. At least one of the vertical insulating layer and semiconductor layer may be formed using the thin-film forming method.

In example embodiments, the vertical insulating layer may include at least one of a silicon oxide layer, a silicon nitride layer, a silicon oxynitride layer, and an aluminum oxide layer. The semiconductor layer may include a silicon layer.

According to example embodiments of inventive concepts, a thin-film forming method includes loading wafers into a process chamber using a boat, and performing a process for forming thin films on the wafers using the process chamber. The wafers may be positioned in the boat and the wafers may be separated from each other in a vertical direction. The wafers may include at least one production wafer and at least one dummy wafer. The dummy wafer may include an insulating substrate with a first surface opposite a second surface. The production wafer may include a substrate having at least one of a different thickness than the insulating substrate and a different material than the insulating substrate. The insulating substrate may include a plurality of openings formed in the insulating substrate. The plurality of openings may penetrate at least a portion of the insulating substrate in a direction from the first surface toward the second surface. The first and second surfaces of the insulating substrate, and an inner surface of each of the plurality of openings, may include protrusion. The performing the process for forming thin films on the wafers may include forming thin films on the production and dummy wafers using the process chamber. The performing the process may include heating the process chamber to a process temperature and supplying a process gas into the process chamber.

In example embodiments, the substrate of the production wafer and the insulating substrate may be formed of different materials.

In example embodiments, the plurality of openings may be arranged along first and second directions crossing each other such that the plurality of openings may be arranged in rows and columns.

In example embodiments, the plurality of openings may have a diameter ranging from 0.3 mm to 1 mm.

In example embodiments, the insulating substrate may be quartz.

BRIEF DESCRIPTION OF THE DRAWINGS

Example embodiments will be more clearly understood from the following brief description taken in conjunction with the accompanying drawings. The accompanying drawings represent non-limiting, example embodiments as described herein. The drawings are not necessarily to scale, emphasis instead being placed upon illustrating principles of inventive concepts. In the drawings.

DETAILED DESCRIPTION

Figure 1:
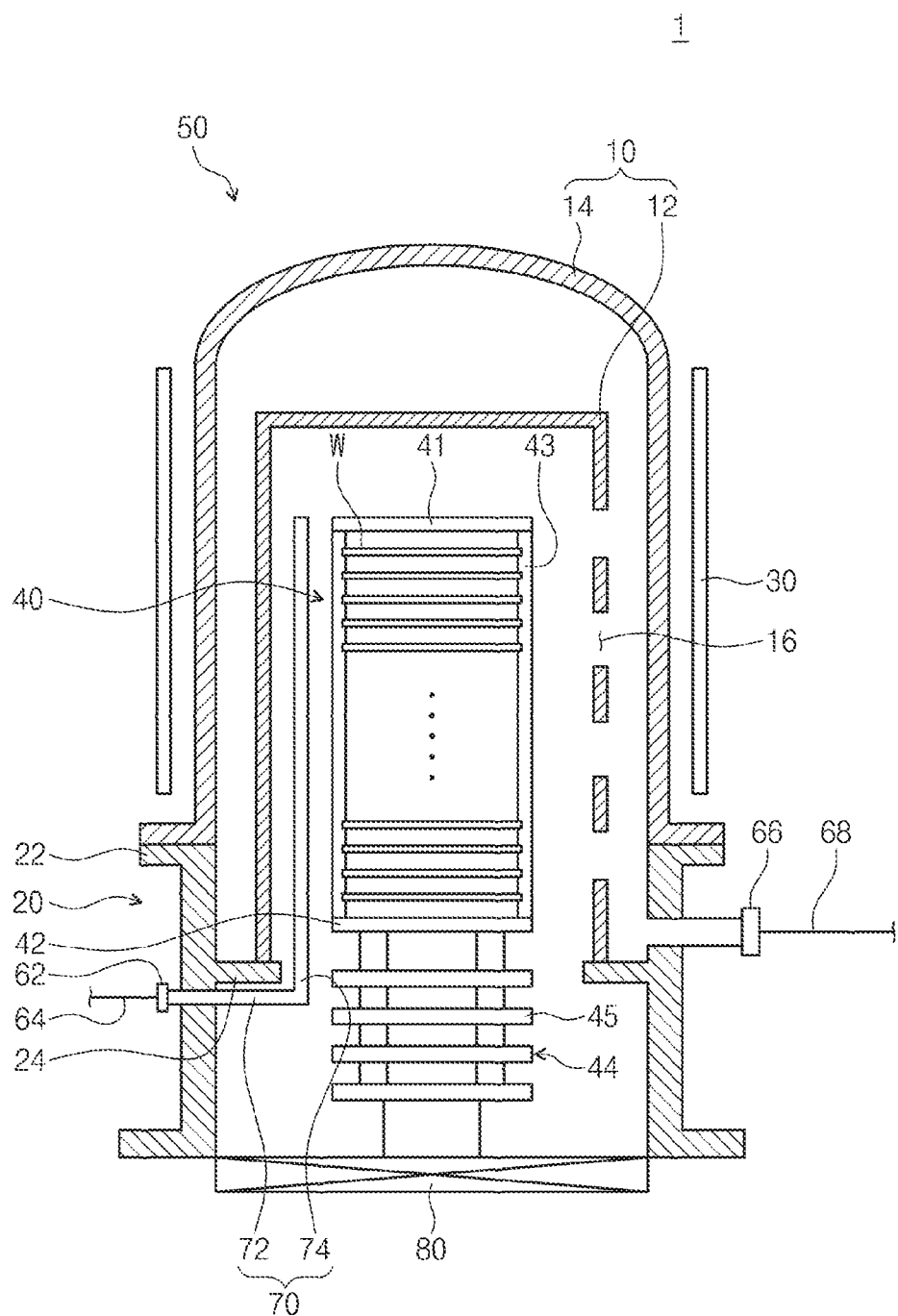
FIG. 1 is a sectional view schematically illustrating a portion of a furnace-type semiconductor fabrication system using a dummy wafer, according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
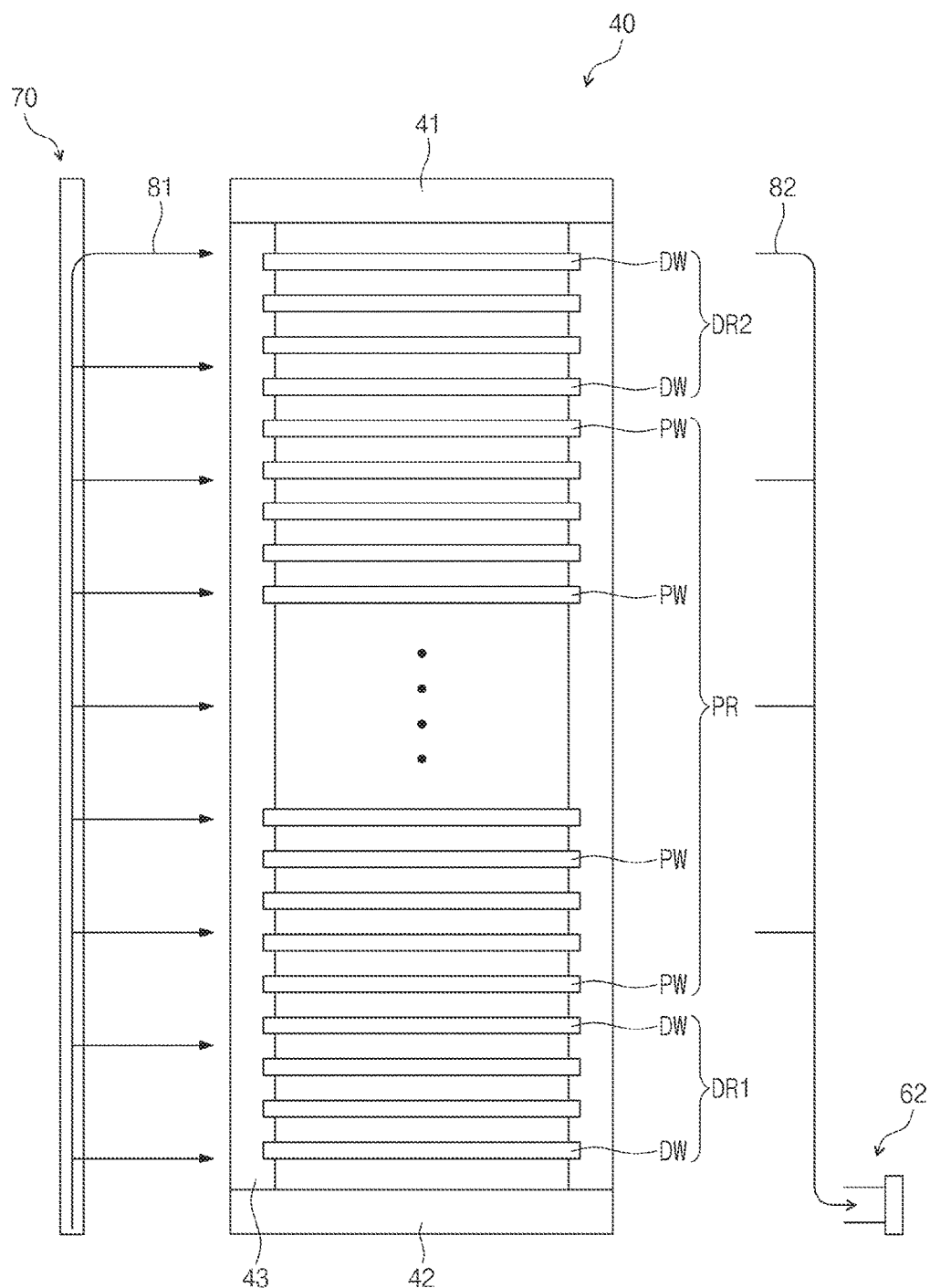
FIG. 2 is a schematic diagram illustrating flows of process and exhaust gases, in the process chamber of FIG. 1.
Figure 3:
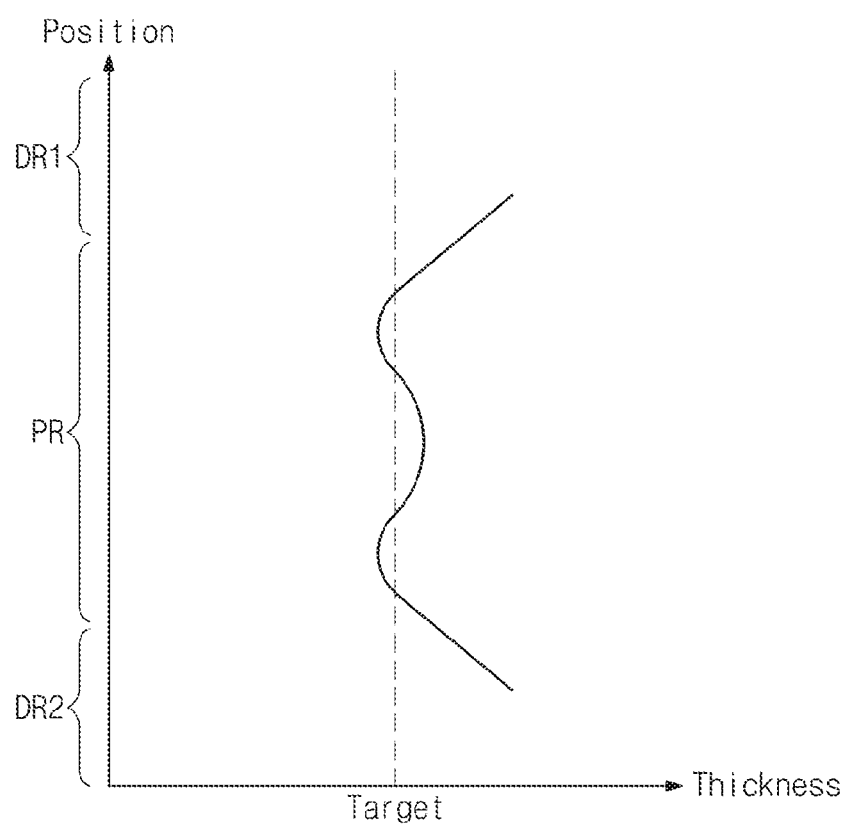
FIG. 3 is a graph showing a thickness variation of a layer formed on a wafer.

FIG. 1 is a sectional view schematically illustrating a portion of a furnace-type semiconductor fabrication system using a dummy wafer, according to example embodiments of inventive concepts. FIG. 2 is a schematic diagram illustrating flows of process and exhaust gases, in the process chamber of FIG. 1. FIG. 3 is a graph showing a thickness variation of a layer formed on a wafer.

Referring to FIGS. 1 and 2, a furnace-type semiconductor fabrication system 1 may be configured to perform a substrate treating process using a dummy wafer according to example embodiments of inventive concepts. The furnace-type semiconductor fabrication system 1 may be configured to allow the substrate treating process to be performed on a substrate (e.g., a wafer W). The substrate treating process may be a low pressure chemical vapor deposition (LP-CVD) process, an oxidation process, or a thermal treatment process. For example, the furnace-type semiconductor fabrication system 1 may be used to form a gate dielectric layer of a MOS transistor of a semiconductor device. Alternatively, the furnace-type semiconductor fabrication system 1 may be used in a thermal treatment process for injecting impurities into a gate electrode of the MOS transistor. However, inventive concepts are not limited thereto. The furnace-type semiconductor fabrication system 1 may be used for various processes for forming a thin layer and/or for thermally treating a thin layer.

The furnace-type semiconductor fabrication system 1 may include a process chamber 50, load-lock chamber (not shown), and a boat 40. The process chamber 50 may provide a room for performing a semiconductor fabrication process (e.g., an LP-CVD process) on the wafers W. The boat 40 may be configured to support the wafers W, when such a process is performed. The load-lock chamber (not shown) may be provided below the process chamber 50. When the boat 40 is placed in the load-lock chamber, the wafers W may be loaded on or unloaded from the boat 40 by a transfer robot (not shown). The transfer robot may be provided outside the load-lock chamber, and a sidewall of the load-lock chamber may have an opening (not shown), allowing an arm of the transfer robot to pass therethrough. The opening may be opened or closed by a door (not shown). The boat 40 may be vertically moved from the process chamber 50 to the load-lock chamber or vice versa by a lifting member (not shown). A gate member 80 may be provided between the load-lock chamber and the process chamber 50 to open or close a pathway for moving the boat 40. If an operation of loading the wafers W on the boat 40 is finished, the boat 40 may be transferred from the load-lock chamber into the process chamber 50.

The boat 40 may include a top plate 41, a bottom plate 42, and vertical supporters 43. The top plate 41 and the bottom plate 42 may have a circular shape and may be disposed to face each other in a vertical direction. A plurality of vertical supporters 43 may be provided between the top plate 41 and the bottom plate 42. As an example, three or four vertical supporters 43 may be provided, and each of the vertical supporters 43 may have a rod-shaped structure elongated in the vertical direction. Slots (not shown) may be formed on each of the vertical supporters 43, and each of the slots may be configured to allow an edge region of the wafer W to be inserted therein. The boat 40 may be formed of quartz. The boat 40 may be supported by a boat supporter 44, and heat-blocking plates 45 may be inserted in the boat supporter 44 in a horizontal direction. The heat-blocking plates 45 may be formed of quartz and may be configured to allow a process gas to be uniformly supplied to a space around the boat 40. Furthermore, the heat-blocking plates 45 may be configured to limit (and/or prevent) heat energy from being lost through a lower portion of the process chamber 50. A boat driving part (not shown) may be disposed below the boat supporter 44 to allow the boat 40 to be moved in the vertical direction or be rotated about its axis.

A plurality of wafers W may be loaded on the boat 40. As shown in FIG. 2, the wafers W may include product wafers PW and dummy wafers DW. The dummy wafers DW may be disposed in upper and lower regions of the boat 40, and the product wafers PW may be disposed between the dummy wafers DW. The process chamber 50 may include a first dummy region DR1 occupied by the lower region of the boat 40, a second dummy region DR2 occupied by the upper region of the boat 40, and a production region PR between the first and second dummy regions DR1 and DR2.

The process chamber 50 may include a process tube 10, a flange 20, and a heating member 30. In example embodiments, the process tube 10 may include an inner tube 12 and an outer tube 14 enclosing the inner tube 12. The inner and outer tubes 12 and 14 may be formed of quartz, and the inner tube 12 may be provided in and spaced apart from the outer tube 14. The outer tube 14 may be shaped like a bottom-open cylinder, and the open bottom of the outer tube 14 may be connected to a top of the flange 20. The inner tube 12 may also be shaped like a bottom-open cylinder and may be configured to allow the boat 40 to be loaded therein. When a process is performed, the boat 40 may be loaded in the inner tube 12. The first and second dummy regions DR1 and DR2 and the production region PR may correspond to three regions in the inner tube 12.

The flange 20 may be disposed on the load-lock chamber (not shown). The flange 20 may be provided to have an opening at a center thereof and to have an opened bottom. The gate member 80 may be disposed below the flange 20. The bottom of the flange 20 may be closed by the gate member 80, and in this case, it is possible to limit and/or prevent an outer air from flowing into the process tube 10. A semiconductor fabrication process (e.g., an LP-CVD process) may be performed in the hermetically-sealed space of the process tube 10. A supporting part 22 may be provided at a top portion of the flange 20 to support the outer tube 14, and a circular-disk-shaped prop 24 may be provided on an inner sidewall of the flange 20 to support the inner tube 12. For example, the prop 24 may protrude from the inner sidewall of the flange 20 in an inward direction.

A process gas supply conduit 64 may be connected to a sidewall of the flange 20 through a process gas injection port 62. A process gas contained in a process gas tank (not shown) may be supplied into the process chamber 50 through the process gas supply conduit 64 and the process gas injection port 62. The process gas may be injected into the inner tube 12 through an injection nozzle 70 and may be supplied onto the wafers W loaded on the boat 40. The injection nozzle 70 may include a horizontal portion 72, which is connected to the process gas supply conduit 64, and a vertical portion 74, which is vertically extended from the horizontal portion 72 and is inserted into the inner tube 12. The vertical portion 74 may be vertically extended in such a way that its top portion is positioned at a level similar to or higher than that of the uppermost one of the dummy wafers DW loaded on the boat 40. The vertical portion 74 may be configured to have a plurality of injection holes (not shown) that are arranged in an extension direction of the vertical portion 74. The process gas may be sprayed onto the wafers PW and DW through the plurality of injection holes. The number of the process gas injection port 62 may be dependent on the kind of material to be formed on the product wafers PW; for example, a plurality of process gas injection ports 62 may be provided.

An exhaust port 66 may be connected to the sidewall of the flange 20. An exhaust conduit 68 may be connected to the exhaust port 66 to realize low pressure environment required for the fabrication process or discharge an exhaust gas (e.g., unreacted part of the process gas and by-product gas). The exhaust port 66 may be provided to be adjacent to the first dummy region DR1 (e.g., the lower region of the boat 40 disposed in the inner tube 12). Opened portions 16 may be formed at a portion of the sidewall of the inner tube 12 adjacent to the exhaust port 66. Each of the opened portions 16 may be shaped like a slot or hole. The unreacted part of the process gas and the by-product gas in the inner tube 12 may be discharged to the outside of the process chamber 50 through the opened portions 16 and the exhaust port 66.

The heating member 30 may be provided outside the sidewall of the process tube 10 to heat the process tube 10 to a process temperature suitable for the fabrication process. The heating member 30 may be spaced apart from the outer tube 14 and may be disposed to enclose the outer tube 14. The heating member 30 may include heating wires enclosing the process tube 10, but inventive concepts are not limited thereto.

In the case where the process gas is injected into the process chamber 50, a thin film may be formed on the wafers PW and DW. There may be a variation in thickness of the thin films to be formed on the wafers PW and DW. For example, the variation in thickness of the thin film formed on the wafer may depend on vertical positions of the wafers PW and DW in the boat 40. For example, as shown in FIG. 3, thicknesses of thin films, which are formed on the dummy wafers DW and the product wafers PW adjacent to the dummy wafers DW, may be greater than a target thickness. This result may be caused by the peculiar structure of the furnace-type semiconductor fabrication system. For example, a partial pressure of the process gas to be supplied to the first dummy region DR1 may be relatively higher than those of other regions. When the process gas flows through the injection nozzle 70 extending in the vertical direction (e.g., along a flow path 81 of the process gas depicted in FIG. 2), the process gas may be partially decomposed to cause the difference in partial pressure of the process gas. As a result, the thin film may be formed to have an increased thickness on the dummy wafers DW at the lower region of the boat 40 and on the product wafers PW adjacent thereto. By contrast, since the exhaust port 66 is provided at the lower region of the process chamber 50 or adjacent to the first dummy region DR1, the process gas supplied to the second dummy region DR2 may be discharged at a relatively low pumping speed (e.g., through a flow path 82 of the exhaust gas depicted in FIG. 2). Accordingly, it takes a relatively longer time to supply the process gas to the second dummy region DR2. Furthermore, although the partial pressure of the process gas supplied to the upper region of the boat 40 is lower than those of other regions, the thin film may be formed to have an increased thickness on the dummy wafers DW in the upper region of the boat 40 and on the product wafers PW adjacent thereto.

For this reason, the dummy wafers DW, instead of the product wafers PW, may be provided in the upper and lower regions of the boat 40. Nevertheless, for the product wafers PW adjacent to the dummy wafers DW, the thin film to be formed thereon may suffer from the thickening issue. In detail, a difference in surface area between the dummy wafer DW and the product wafer PW may lead to a difference in consumption amount of the process gas and a variation in internal pressure of the process chamber 50, affecting the flow of the process gas. For example, the pressure of the process gas may be relatively high in the dummy regions DR1 and DR2, and thus, the process gas may be moved from the dummy regions DR1 and DR2 to the production region PR adjacent thereto and may be deposited on the product wafers PW. In particular, in the case where the dummy wafer DW is provided in the form of a non-patterned wafer (NPW), there may be a difference in surface area between the dummy wafer DW and the product wafer PW, and in this case, the variation in thickness of the thin film may be increased. To limit and/or avoid this issue, a patterned dummy wafer, whose surface area is equal to or similar to that of the product wafer PW, may be used as the dummy wafer DW. In general, a silicon-based wafer, on which a patterning process is performed or a pattern structure similar to the product wafer PW is provided, may be used as the dummy wafer DW. However, in this case, it is difficult to increase the surface area of the dummy wafer DW through the patterning process, and moreover, owing to an increase in fabrication cost, it is difficult to apply this method to a mass production process.

According to example embodiments of inventive concepts, the dummy wafer DW may be fabricated with low cost and may be configured to allow a patterning process for increasing the surface area of the dummy wafer DW and a cleaning process for reusing the dummy wafer DW to be easily performed thereon. Hereinafter, various dummy wafers with pattern structures will be described with reference to the accompanying drawings. The types of dummy wafers DW used in the dummy regions DR1 and DR2 may be the same or different.

Figure 4:
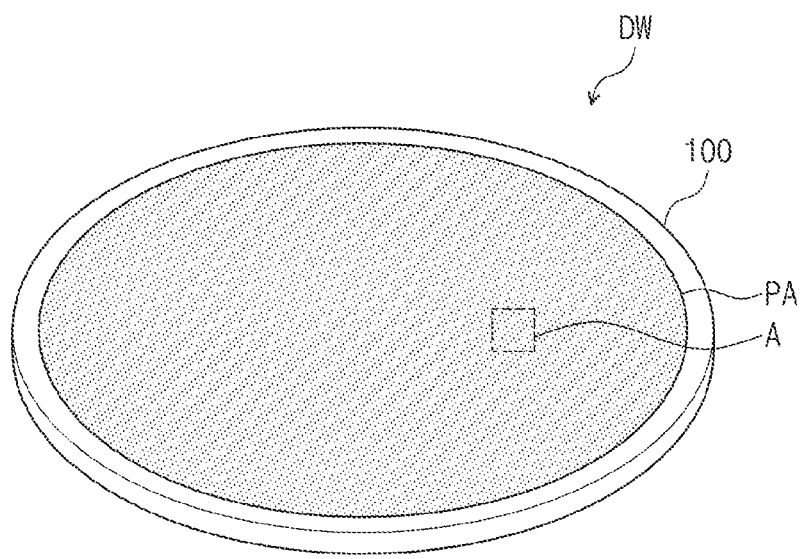
FIG. 4 is a schematic perspective view illustrating a dummy wafer according to example embodiments of inventive concepts.
Figure 5A:
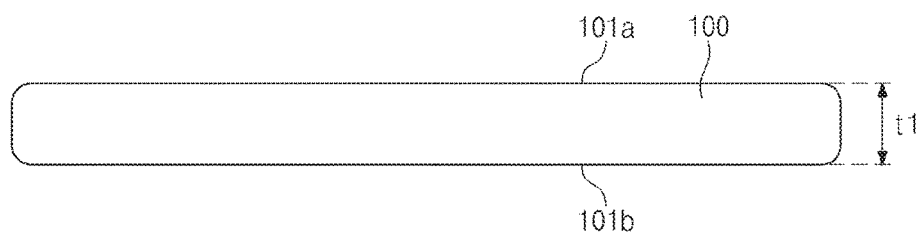
FIGS. 5A and 5B are sectional views illustrating a difference in thickness between dummy and product wafers, according to example embodiments of inventive concepts.
Figure 5B:
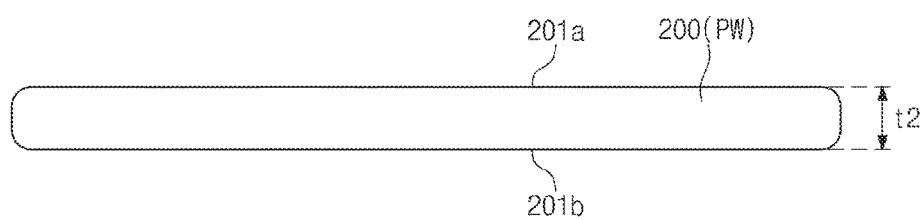
Figure 6:
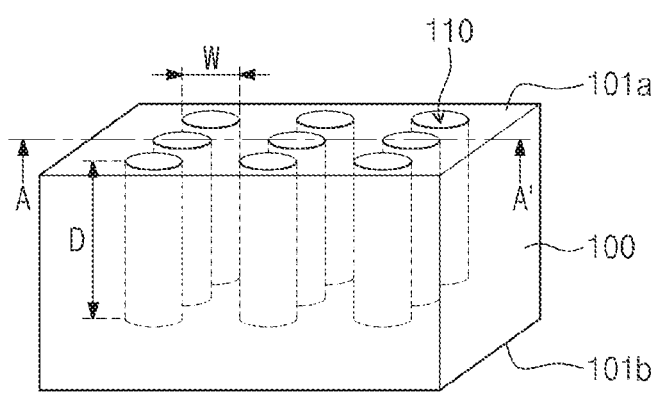
FIG. 6 is a perspective view illustrating a portion 'A' of a pattern region of FIG. 4 to describe an example of a dummy wafer according to example embodiments of inventive concepts.
Figure 6:
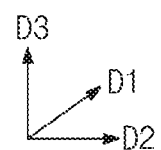
Figure 7A:
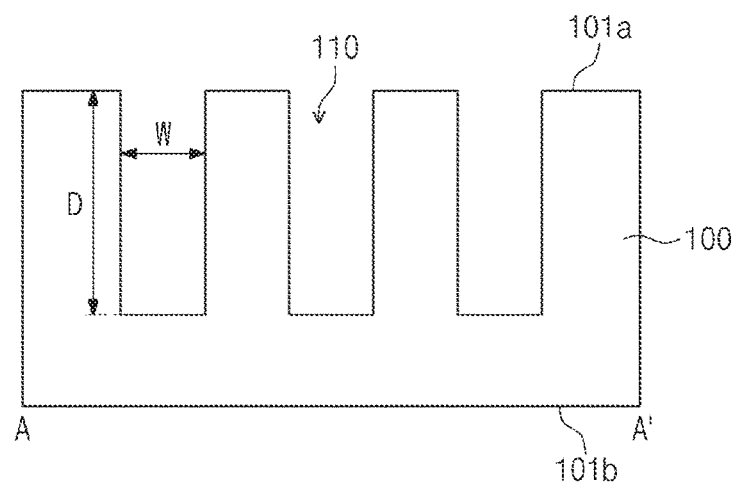
FIGS. 7A and 7B are sectional views taken along line A-A' of FIG. 6.
Figure 7B:
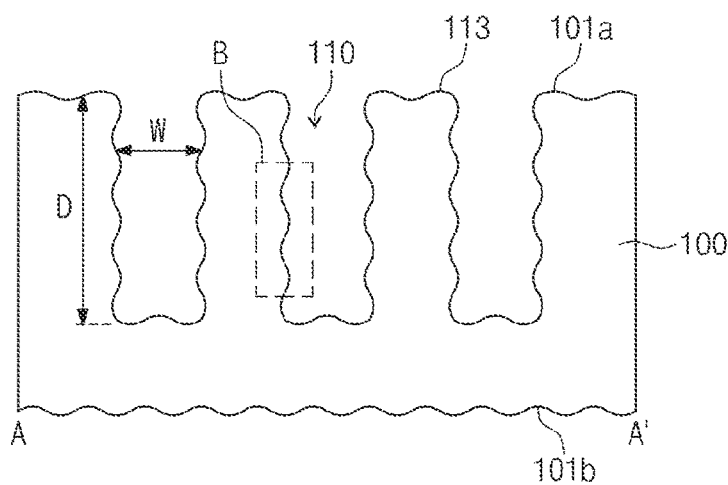
Figure 7C:
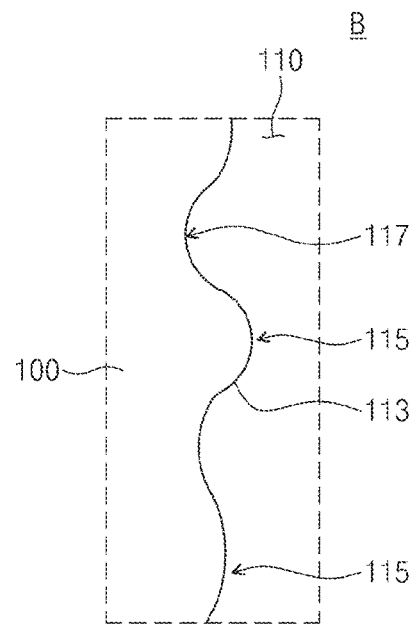
FIG. 7C is an enlarged sectional view of a portion 'B' of FIG. 7B.
Figure 7D:
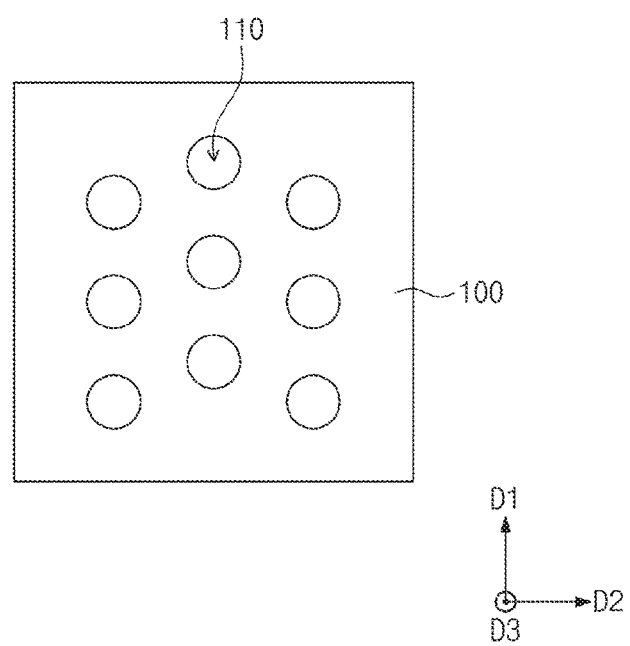
FIG. 7D is a plan view illustrating the structure of FIG. 6.

FIG. 4 is a schematic perspective view illustrating a dummy wafer according to example embodiments of inventive concepts. FIGS. 5A and 5B are sectional views illustrating a difference in thickness between dummy and product wafers, according to example embodiments of inventive concepts. FIG. 6 is a perspective view illustrating a portion 'A' of a pattern region of FIG. 4 to describe an example of a dummy wafer according to example embodiments of inventive concepts. FIGS. 7A and 7B are sectional views taken along line A-A' of FIG. 6. FIG. 7C is an enlarged sectional view of a portion 'B' of FIG. 7B. FIG. 7D is a plan view illustrating the structure of FIG. 6.

Referring to FIGS. 4, 5A, 5B, 6, and 7A, a substrate 100 with a pattern region PA may be provided. The substrate 100 may have a top surface 101a, on which the pattern region PA is provided, and a bottom surface 101b facing the top surface 101a. According to example embodiments of inventive concepts, the substrate 100 may include a material different from a substrate 200 of the product wafer PW. For example, the substrate 200 of the product wafer PW may be a semiconductor substrate or a semiconductor-based structure, whereas the substrate 100 of the dummy wafer DW may be an insulating substrate. As an example, the substrate 100 of the dummy wafer DW may be formed of quartz, but inventive concepts are not limited thereto. For example, in some applications, one of ordinary skill in the art would appreciate that the insulating substrate 100 may be coated with a material that is different than quartz (e.g., yttria), which may extend the lifetime of the dummy wafer. Hereinafter, the substrate 200 of the product wafer PW will be referred to as a semiconductor substrate 200, and the substrate 100 of the dummy wafer DW will be referred to as an insulating substrate 100.

The same pattern structures may be provided on the pattern region PA. The pattern structures may include a plurality of openings 110 penetrating at least a portion of the insulating substrate 100. Since the insulating substrate 100 is formed of an insulating material (e.g., quartz), the patterning process may be more easily performed on the insulating substrate 100 than on the silicon-based semiconductor substrate 200. As an example, the openings 110 may be formed by performing a laser drilling process on the insulating substrate 100. However, inventive concepts are not limited thereto. The openings 110 may be formed throughout the pattern region PA, and as will be described in detail below, shapes, sizes, and/or the number of the openings 110 may be variously changed in consideration of technical requirements on the surface area of the dummy wafer DW. As shown in FIG. 4, the insulating substrate 100 may be shaped like a circular disk and have a diameter of 300 mm, but inventive concepts are not limited thereto.

As shown in FIGS. 5A and 5B, the insulating substrate 100 may have a first thickness t1, and the semiconductor substrate 200 may have a second thickness t2 smaller than the first thickness t1. The first thickness t1 may be defined as a distance between the top surface 101a and the bottom surface 101b of the insulating substrate 100, and the second thickness t2 may be defined as a distance between a top surface 201a and a bottom surface 201b of the semiconductor substrate 200. In example embodiments, the first thickness t1 may range from 1 mm to 5 mm, and the second thickness t2 may be about 0.8 mm (e.g., 0.8 mm+/−0.1 mm). Since the insulating substrate 100 is thicker than the semiconductor substrate 200, it is possible to increase the size of the pattern structures (e.g., the openings 110) and thereby to increase the surface area of the insulating substrate 100.

As shown in FIGS. 6 and 7A, each of the pattern structures (e.g., the openings 110) of the pattern region PA may be a hole penetrating at least a portion of the insulating substrate 100. In example embodiments, each of the openings 110 may be a not-open hole with a closed bottom surface. Accordingly, the shape of the opening 110 may be represented in terms of a width W and a depth D. The width W of the opening 110 may be defined as its diameter. The depth D of the opening 110 may be defined as a distance between the top surface 101a of the insulating substrate 100 and the bottom surface of the opening 110. In example embodiments, the width W of the openings 110 may range from 0.3 mm to 1 mm. In the case where the width W of the openings 110 is smaller than 0.3 mm, the openings 110 may be filled with a thin film to be formed on the insulating substrate 100, even when the reusing number of the dummy wafer DW is small. In this case, a cleaning process for removing the thin film from the openings 110 should be performed to reuse the dummy wafer DW. In other words, in the case where the width W of the openings 110 is smaller than 0.3 mm, the dummy wafer DW may suffer from a short usage period. Furthermore, in the case where the width W of the opening 110 is small, a cleaning process for reusing the dummy wafer DW may suffer from a difficulty in removing the thin film from the openings 110. This may lead to deterioration in recycling efficiency of the dummy wafer DW. In addition, even when the cleaning process on the dummy wafer DW is finished, the thin film remaining in the openings 110 may serve as a particle source. By contrast, in the case where the width W of the openings 110 is larger than 1 mm, a process of forming the openings 110 may suffer from an increase in process difficulty and cost. The depth D of the openings 110 may be variously changed in consideration of technical requirements, but it may be less than the first thickness t1 of the insulating substrate 100.

The openings 110 may be formed through the insulating substrate 100 to have a two-dimensional arrangement. In example embodiments, the openings 110 may be spaced apart from each other in a first direction D1 and may be arranged to form at least one column parallel to the first direction D1. In addition, the plurality of the openings 110 may be spaced apart from each other in a second direction D2 crossing the first direction D1 and may be arranged along the second direction D2 to form a row. In example embodiments, as shown in FIG. 7D, the openings 110 may be arranged to form a zigzag arrangement in the first direction D1. For example, the openings 110 may be arranged to form two adjacent columns (e.g., first and second columns), and the openings 110 of the first and second columns may be arranged in a zigzag manner along the first direction D1.

In example embodiments, the openings 110 may be formed by performing a laser drilling process on the insulating substrate 100. However, inventive concepts are not limited thereto. The openings 110 may be formed throughout the pattern region PA, and the number of and/or a distance between the openings 110 may be variously changed in consideration of technical requirements on the surface area of the insulating substrate 100.

To further increase the surface area of the insulating substrate 100, a surface treatment process may be performed on the insulating substrate 100 provided with the openings 110. In example embodiments, the surface treatment process may include sequentially performing a sandblasting process and an etching process on the insulating substrate 100. However, inventive concepts are not limited thereto. The etching process may include a wet etching process, in which hydrogen fluoride (HF) is used as etchant. The surface treatment process may be performed to randomly recess the insulating substrate 100. As a result, protrusions 113 may be formed on the surface of the insulating substrate 100, as shown in FIG. 7B. The protrusions 113 may be formed on the top surface 101a and the bottom surface 101b of the insulating substrate 100 and on an inner surface of each of the openings 100. Furthermore, the protrusions 113 may be formed on a side surface of the insulating substrate 100. The protrusions 113 may be island-shaped structures, which are randomly arranged, and may be irregular in size or shape. For example, referring to FIG. 7C, when viewed in a sectional view, the insulating substrate 100 may have a surface including convex portions 115 and concave portions 117, and the height of the convex portions 115 and/or a distance between the convex portions 115 may be irregular. As shown in FIG. 7C, there may be a variation in protrusion lengths of the protrusions 113, when measured in a direction toward a center of the opening 110. As described above, since the protrusions 113 are formed on the surface of the insulating substrate 100, the insulating substrate 100 may have an increased surface roughness. For example, a surface roughness (Ra) of the insulating substrate 100 may range from 0.5 μm to 10 μm. In example embodiments, a surface area of the insulating substrate 100 of FIG. 7B may be increased by about 10-20%, compared to the insulating substrate 100 of FIG. 7A.

Figure 8:
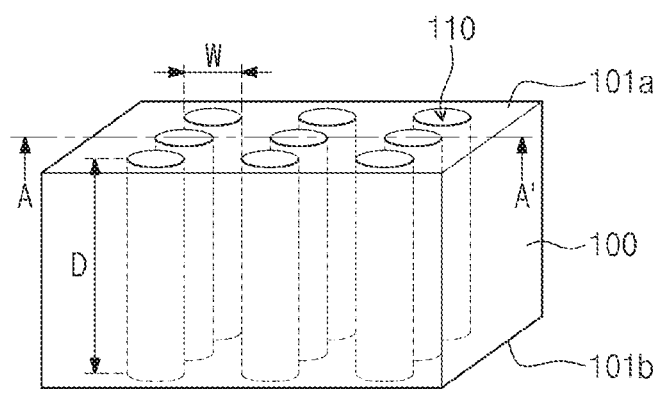
FIG. 8 is a perspective view illustrating the portion 'A' of the pattern region of FIG. 4 to describe another example of a dummy wafer according to example embodiments of inventive concepts.
Figure 8:
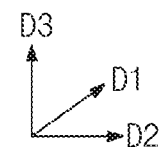
Figure 9A:
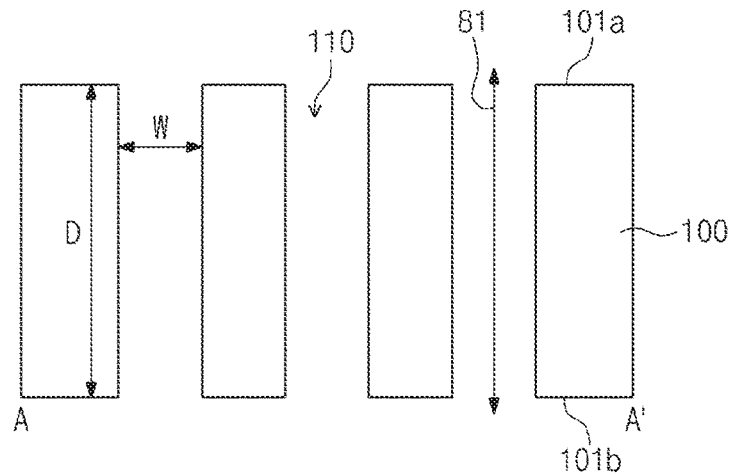
FIGS. 9A and 9B are sectional views taken along line A-A' of FIG. 8.
Figure 9B:
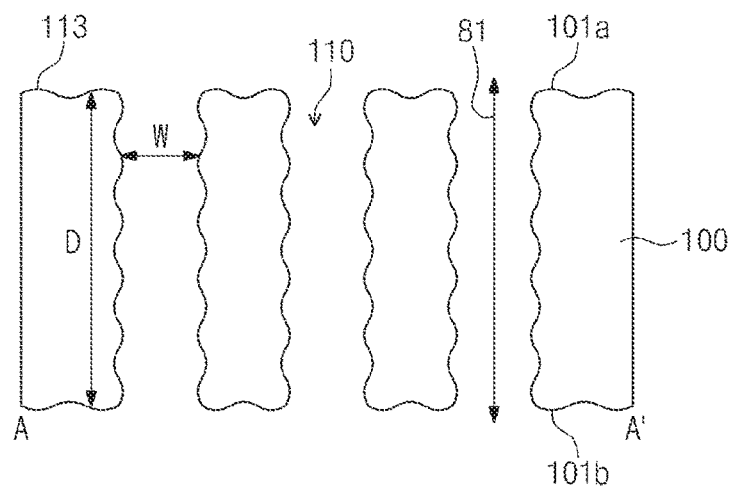

FIG. 8 is a perspective view illustrating the portion 'A' of the pattern region of FIG. 4 to describe another example of a dummy wafer according to example embodiments of inventive concepts. FIGS. 9A and 9B are sectional views taken along line A-A' of FIG. 8. In the following description, a previously-described element may be identified by a similar or identical reference number without repeating an overlapping description thereof, for the sake of brevity.

Referring to FIGS. 8 and 9A, the openings 110 may be open holes penetrating the insulating substrate 100 from the top surface 101a to the bottom surface 101b. In other words, the openings 110 may be formed to wholly penetrate the insulating substrate 100 in the vertical direction. Accordingly, the depth D of the openings 110 may be the same as the first thickness t1 of the insulating substrate 100. The width W of the openings 110 may be the same as that described with reference to FIG. 7B. Since the openings 110 are formed to have the open hole shape, the process gas may flow through the openings 110 in the vertical direction. This may make it possible to realize a smooth flow of the process gas on the dummy wafers DW and thereby to reduce a variation in pressure of the process gas. As a result, it is possible to suppress and/or prevent thin films, which will be formed on the product wafers PW adjacent to the dummy wafers DW from becoming thick. In addition, since the openings 110 are formed to have the open hole shape, the cleaning gas may be more easily supplied into the openings 110 when the cleaning process for reusing the dummy wafer DW is performed. Accordingly, it is possible to more easily remove the thin film from the openings 110, compared to the case of FIG. 7B.

In order to increase the surface area of the insulating substrate 100, the protrusions 113 may be formed on the surface of the insulating substrate 100, as shown in FIG. 9B. For example, the protrusions 113 may be formed on the top surface 101a and the bottom surface 101b of the insulating substrate 100 and on the inner surface of each of the openings 110. The protrusions 113 may be configured to have the same or similar features (e.g., in terms of arrangement, shape, and size) as those described with reference to FIGS. 7B and 7C.

Figure 10:
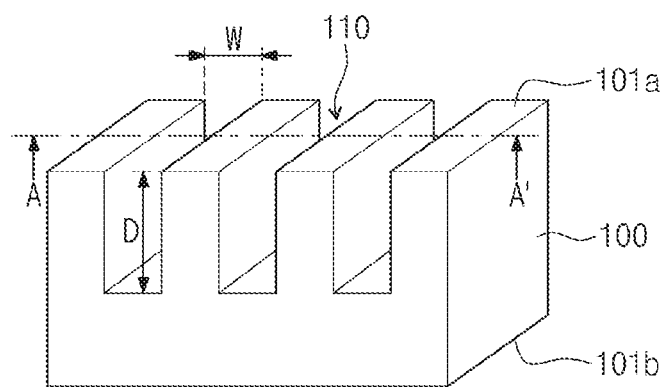
FIG. 10 is a perspective view illustrating the portion 'A' of the pattern region of FIG. 4 to describe other example of a dummy wafer according to example embodiments of inventive concepts.
Figure 10:
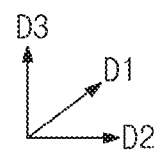
Figure 11A:
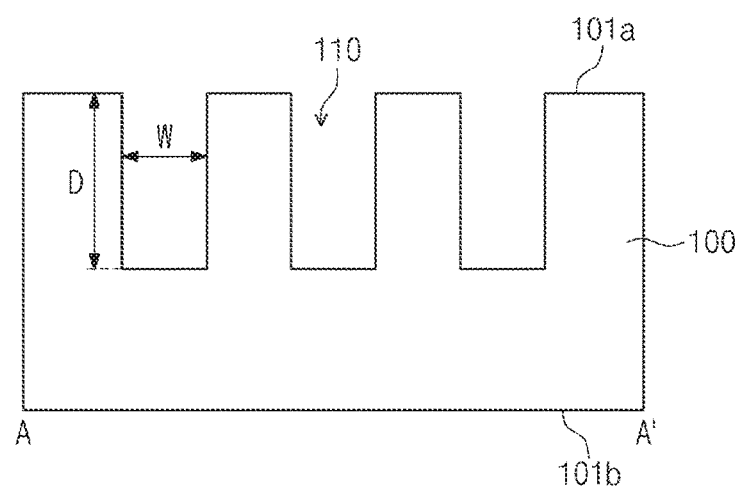
FIGS. 11A and 11B are sectional views taken along line A-A' of FIG. 10.
Figure 11B:
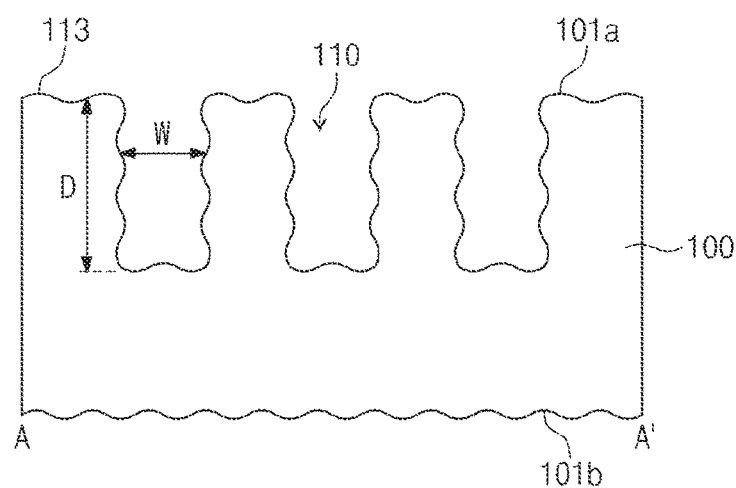
Figure 11C:
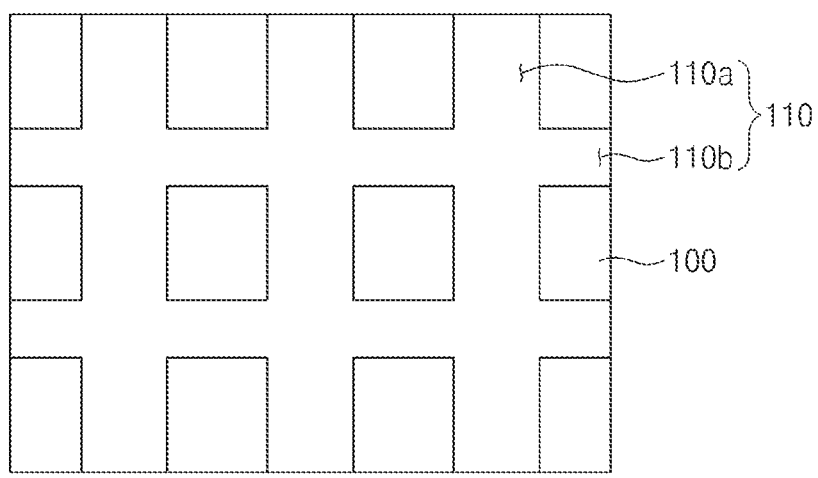
FIG. 11C is a plan view illustrating the structure of FIG. 10.

FIG. 10 is a perspective view illustrating the portion 'A' of the pattern region of FIG. 4 to describe other example of a dummy wafer according to example embodiments of inventive concepts. FIGS. 11A and 11B are sectional views taken along line A-A' of FIG. 10. FIG. 11C is a plan view illustrating the structure of FIG. 10. In the following description, a previously-described element may be identified by a similar or identical reference number without repeating an overlapping description thereof, for the sake of brevity.

Referring to FIGS. 10B and 11A, the openings 110 may be line-shaped trenches extending in the first direction D1. The openings 110 may be spaced apart from each other in a second direction D2 that is not parallel to the first direction D1. The shape of the opening 110 may be represented in terms of a width W and a depth D. A width W of the opening 110 may be defined as a distance between both sidewalls of the insulating substrate 100 defining the openings 110. The depth D of the opening 110 may be defined as a distance between the top surface 101a of the insulating substrate 100 and the bottom surface of the opening 110. In example embodiments, the width W of the opening 110 may range from 0.3 mm to 5 mm. The depth D of the opening 110 may range from 0.3 mm to 2.5 mm. The opening 110 may be formed in such a way that the maximum of the depth D is less than half the first thickness t1 of the insulating substrate 100. As described with reference to FIG. 7B, the above values of the width W and the depth D of the opening 110 may be designed in consideration of the surface area, the usage period, and the recycling efficiency of the dummy wafer DW. Furthermore, the width W and the depth D of the opening 110 may be designed in consideration of warpage characteristics of the dummy wafer DW. In the case where the width W is larger than 5 mm or the depth D is larger than half the first thickness t1 of the dummy wafer DW, the dummy wafer DW may suffer from the warpage, because the openings 110 are formed to have the elongated trench shape.

In order to increase the surface area of the insulating substrate 100, the protrusions 113 may be formed on the surface of the insulating substrate 100, as shown in FIG. 11B. For example, the protrusions 113 may be formed on the top surface 101a and the bottom surface 101b of the insulating substrate 100 and on the inner surface of each of the openings 110. The protrusions 113 may be configured to have the same or similar features (e.g., in terms of arrangement, shape, and size) as those described with reference to FIGS. 7B and 7C.

In example embodiments, when viewed in a plan view, the openings 110 may be formed to have a lattice structure. For example, as shown in FIG. 11C, the openings 110 may include first openings 110a, each of which is formed to have a trench shape extending in the first direction D1, and second openings 110b, each of which is formed to have a trench shape extending in the second direction D2 that is not parallel to the first direction D1. The first openings 110a and the second openings 110b may be formed to intersect with each other. The first openings 110a may be disposed spaced apart from each other in the second direction D2, and the second openings 110b may be disposed spaced apart from each other in the first direction D1. Since the openings 110 are formed to have the lattice structure, it is possible to improve the warpage characteristics of the dummy wafer DW, compared with the case that the openings 110 are unidirectionally formed.

Hereinafter, a substrate treating method using the dummy wafers DW will be described.

Figure 12:
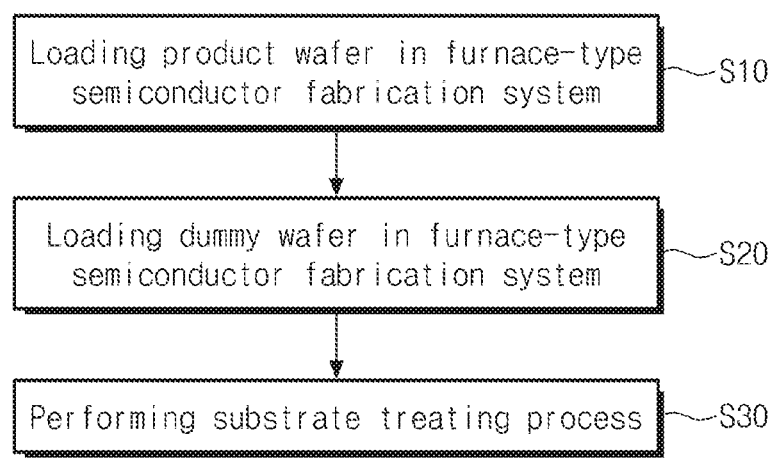
FIG. 12 is a flow chart illustrating a substrate treating method, in which dummy wafers according to example embodiments of inventive concepts are used.

FIG. 12 is a flow chart illustrating a substrate treating method, in which dummy wafers according to example embodiments of inventive concepts are used. The description that follows will refer to an example in which a substrate treating method using the dummy wafers DW is performed in the furnace-type semiconductor fabrication system 1 of FIG. 1, but inventive concepts are not limited thereto.

Referring to FIGS. 1, 2, and 12, the substrate treating method using the dummy wafers DW may include loading the product wafer PW in the furnace-type semiconductor fabrication system 1 (in S10), loading the dummy wafer DW in the furnace-type semiconductor fabrication system 1 (in S20), and performing a substrate treating process (in S30).

For example, the product wafer PW may be a wafer, on which a semiconductor fabrication process has been performed. The dummy wafer DW may be the insulating substrate 100 with the openings 110. As an example, the dummy wafer DW may be provided to have a surface area that is at least 80% of that of the product wafer PW. The product wafer PW and the dummy wafer DW may be loaded on the boat 40. For example, a plurality of the dummy wafers DW may be loaded on the upper and lower regions of the boat 40, and at least one product wafer PW may be loaded on a region of the boat 40 between the dummy wafers DW. The at least one product wafer PW may include a plurality of product wafers PW. The boat 40, on which the wafers PW and DW are loaded, may be moved in the inner tube 12 of the process chamber 50. Thereafter, the bottom of the flange 20 may be closed by the gate member 80 provided below the flange 20, and thus, the process chamber 50 may be hermetically sealed. As a result, steps of S10 and S20 are finished.

Next, the substrate treating process (in S30) may be performed on the wafers PW and DW. The substrate treating process may be, for example, a chemical vapor deposition (CVD) or atomic layer deposition (ALD) process. In detail, a process gas for forming a thin film may be supplied into the process chamber 50. The process gas may be injected into the inner tube 12 through the injection nozzle 70 and may be supplied onto the wafers PW and DW. The process gas may be deposited on the wafers PW and DW, thereby forming the thin film. In example embodiments, the dummy wafers DW may be provided to have pattern structures (e.g., the openings 110), whose surface area is equal to or similar to that of the product wafers PW, and thus, it is possible to reduce a variation in thickness of the thin film, which may occur depending on vertical positions of the product wafers PW loaded on the boat 40. In other words, it is possible to improve thickness uniformity of the thin films to be formed on the product wafers PW. In addition, since the dummy wafers DW are formed of the same material (e.g., quartz) as that of the boat 40 and/or the process tube 10, it is possible to stably maintain process environment of the process chamber 50 during the substrate treating process. Although an LP-CVD process has been described as an example of the substrate treating process, inventive concepts are not limited thereto. For example, in example embodiments, the substrate treating process using the dummy wafers DW may include an oxidation process or a thermal treatment process.

According to example embodiments of inventive concepts, the cleaning process for reusing the dummy wafer DW may be performed using the furnace-type semiconductor fabrication system 1, without an additional cleaning system. For example, in the case where a thin-film forming process is performed in the furnace-type semiconductor fabrication system 1, reaction materials or by-products, which are produced in the thin-film forming process, may be deposited on not only the wafers PW and DW but also an inner surface (e.g., inner and outer surfaces of the inner tube 12, an inner surface of the outer tube 14, an inner surface of the flange 20, and so forth) of the process chamber 50, thereby forming extraneous matter. In the case where the thin-film forming process is repeated, an amount of the extraneous matter may be increased, and in certain cases, the extraneous matter may be detached from the inner surface of the process chamber 50 to serve as particle sources. Accordingly, if the thin-film forming process is repeated a desired (and/or alternatively predetermined) number of times, a chamber cleaning process may be performed to remove the extraneous matter from the inner surface of the process chamber 50. According to example embodiments of inventive concepts, since the dummy wafer DW is formed of the same material (e.g., quartz) as that of the boat 40 and/or the process tube 10, the dummy wafer DW may be cleaned by performed the chamber cleaning process on the process chamber 50, in which the dummy wafer DW is loaded. For example, the thin films formed on the dummy wafer DW may be removed by a cleaning gas supplied into the process chamber 50 for the chamber cleaning process. In other words, the cleaning process on the dummy wafer DW may be performed in-situ using the chamber cleaning process on the furnace-type semiconductor fabrication system 1, and thus, it is possible to reduce cost for the process of cleaning the dummy wafer DW (e.g., management cost), to increase an operation rate of other cleaning systems, and thereby to improve productivity of a semiconductor fabrication facility (FAB).

Hereinafter, a method of fabricating a semiconductor device using the dummy wafers according to example embodiments of inventive concepts will be described.

FIGS. 13 through 17 are sectional views illustrating a method of fabricating a semiconductor device using dummy wafers according to example embodiments of inventive concepts.

Figure 13:
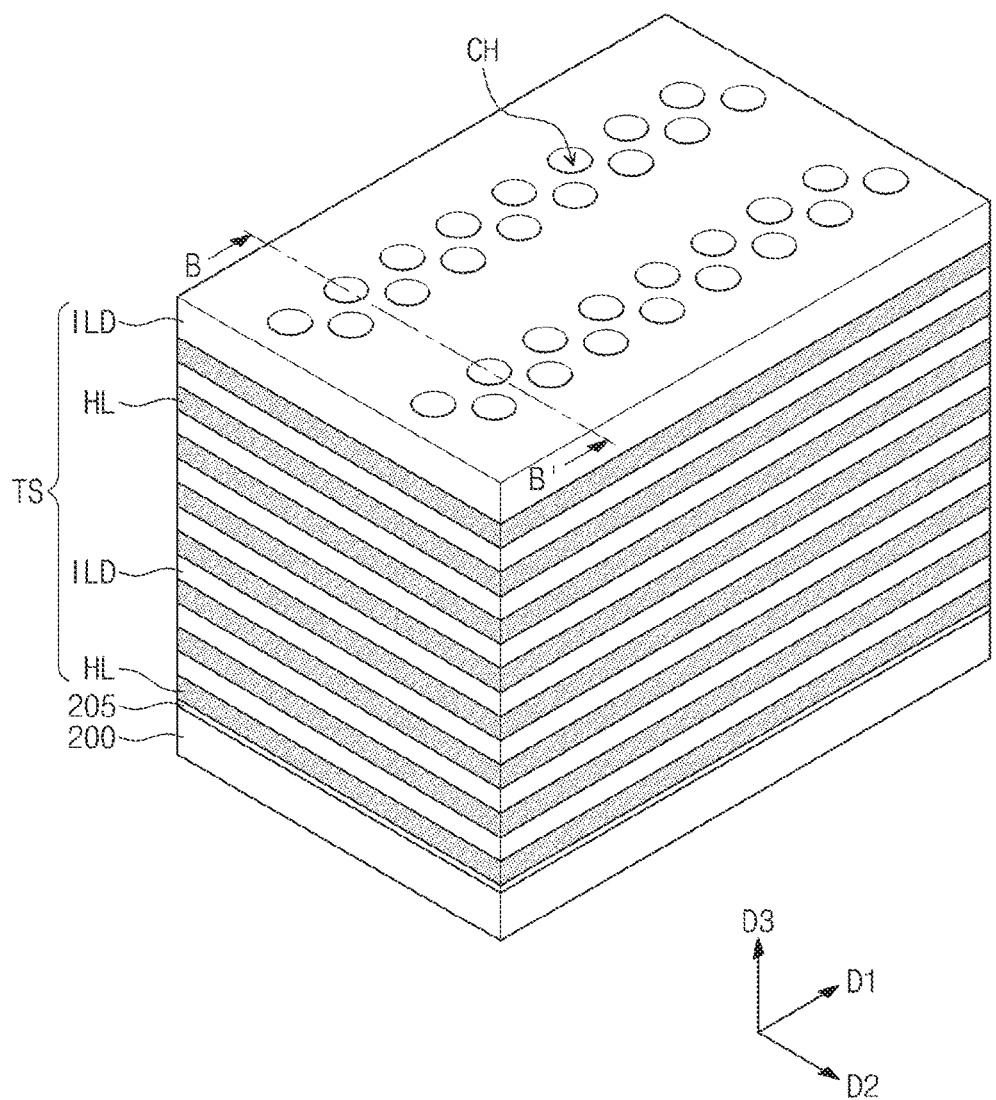
FIGS. 13 through 17 are sectional views illustrating a method of fabricating a semiconductor device using dummy wafers according to example embodiments of inventive concepts.
Figure 14:
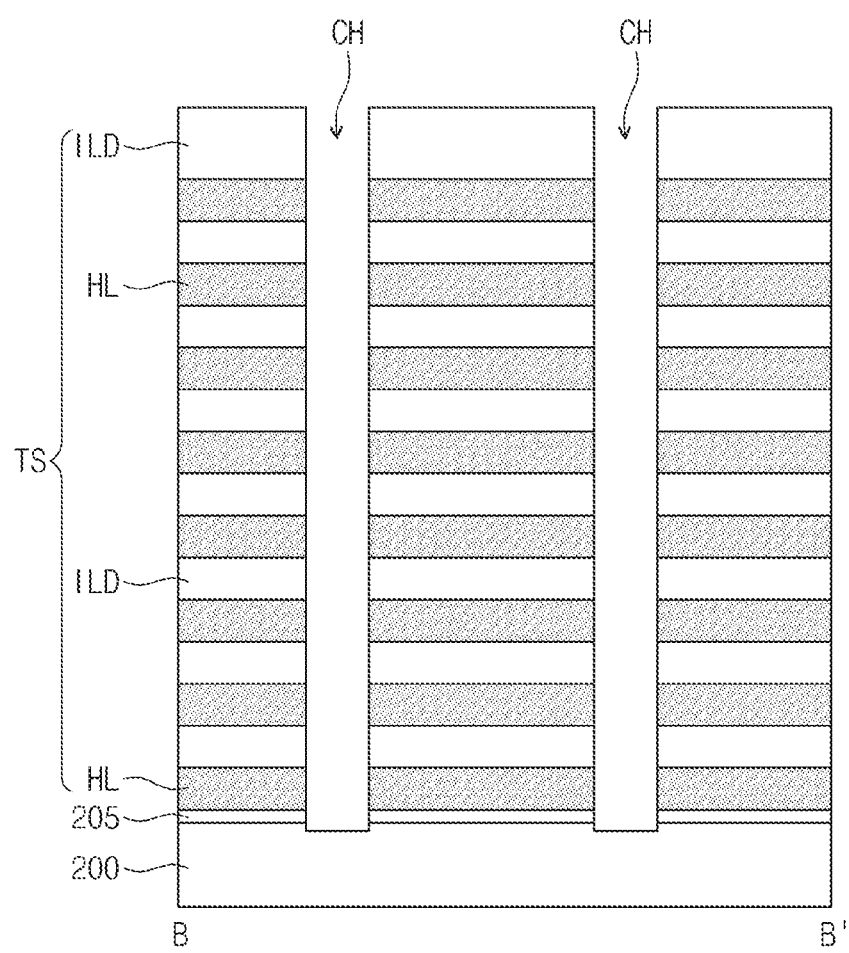

Referring to FIG. 13, a layered structure TS may be formed on the semiconductor substrate 200. The layered structure TS may include sacrificial layers HL and insulating layers ILD, which are alternately and repeatedly stacked on the semiconductor substrate 200. The sacrificial layers HL may be formed of a material, which can be selectively etched with a higher etch rate than that of the insulating layers ILD. In example embodiments, the sacrificial layers HL and the insulating layers ILD may be formed to have a high etch selectivity in a wet etching process using chemical solution and a low etch selectivity in a dry etching process using etching gas. In example embodiments, the sacrificial layers HL may be formed to have substantially the same thickness. However, in example embodiments, the uppermost and lowermost ones of the sacrificial layers HL may be formed to be thicker than the others. The insulating layers ILD may be formed to have substantially the same thickness. Alternatively, in example embodiments, at least one (e.g., the uppermost one) of the insulating layers ILD may have a different thickness than the others.

In example embodiments, the sacrificial layers HL and the insulating layers ILD may be formed of insulating materials having different etch rates to a specific etchant. For example, the sacrificial layers HL may be at least one of a silicon layer, a silicon oxide layer, a silicon carbide layer, a silicon oxynitride layer, or a silicon nitride layer. The insulating layers ILD may be at least one of a silicon layer, a silicon oxide layer, a silicon carbide layer, a silicon oxynitride layer, or a silicon nitride layer, but it may be formed of a material selected to be different from the sacrificial layer HL. For example, the sacrificial layers HL may be formed of a silicon nitride layer, and the insulating layers ILD may be formed of a silicon oxide layer. In example embodiments, the sacrificial layers HL may be formed of a conductive material, and the insulating layers ILD may be formed of an insulating material. Furthermore, a lower insulating layer 105 may be formed between the semiconductor substrate 200 and the layered structure TS. For example, the lower insulating layer 105 may be or include a silicon oxide layer, which may be formed by a thermal oxidation process. Alternatively, the lower insulating layer 105 may be or include a silicon oxide layer, which may be formed by a deposition process. The lower insulating layer 105 may be formed to be thinner than the sacrificial layers HL and the insulating layers ILD provided thereon. In example embodiments, the lower insulating layer 105 may be formed by a substrate treating process using the dummy wafers DW according to example embodiments of inventive concepts.

A plurality of channel holes CH may be formed through the layered structure TS to expose the semiconductor substrate 200. The plurality of channel holes CH may be two-dimensionally arranged, when viewed in plan view. In other words, the plurality of channel holes CH may be arranged to form a plurality of rows parallel to the first direction D1 and a plurality of columns parallel to the second direction D2 crossing the first direction D1. The channel holes CH may be formed to have a zigzag arrangement in the first direction D1. In example embodiments, the formation of the channel holes CH may include forming mask patterns (not shown) on the layered structure TS and performing an etching process using them as an etch mask. The top surface of the semiconductor substrate 200 may be over-etched during the etching process. In other words, the top surface of the semiconductor substrate 200 may be partially recessed.

Figure 15:
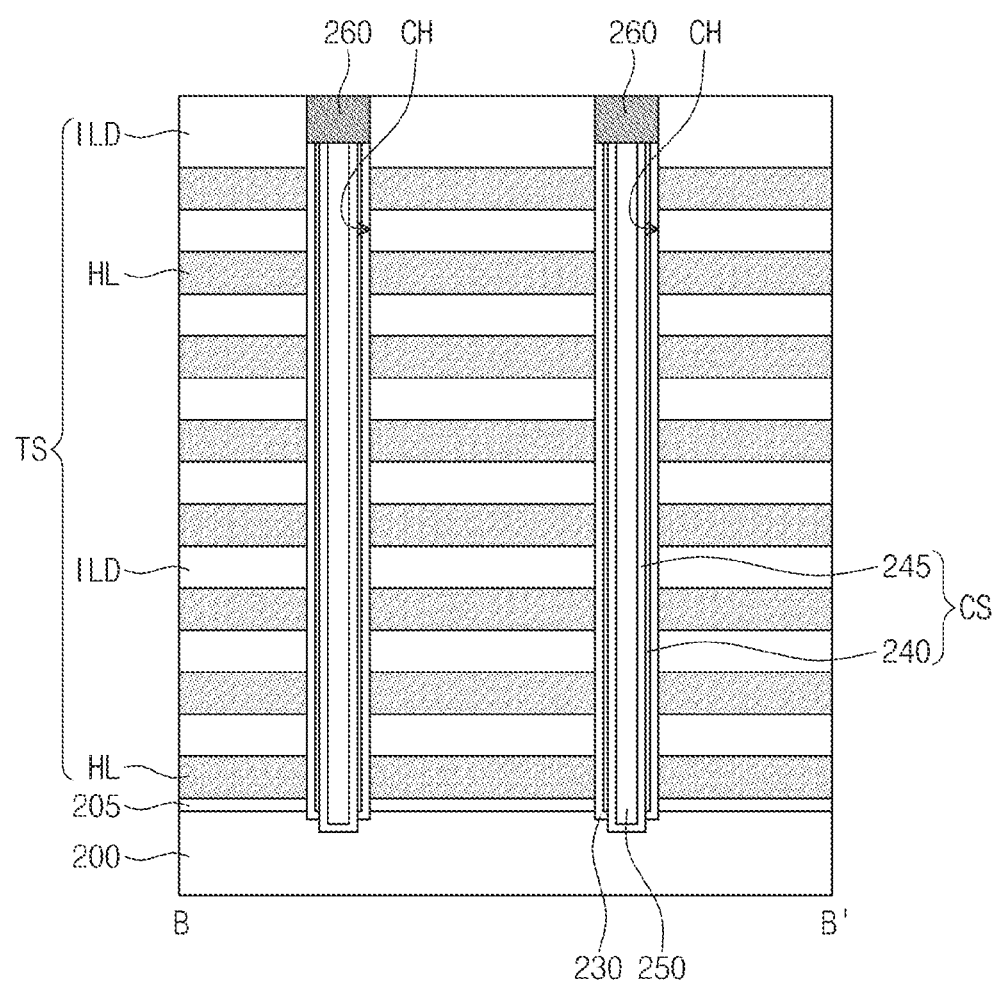

Referring to FIG. 15, channel structures CS with first semiconductor patterns 240 and second semiconductor patterns 245 may be formed in the channel holes CH.

In detail, vertical insulating patterns 230 and the first semiconductor patterns 240 may be formed in the channel holes CH. In example embodiments, the formation of the vertical insulating patterns 230 and the first semiconductor patterns 240 may include sequentially forming a vertical insulating layer and a first semiconductor layer to cover inner surfaces of the channel holes CH and anisotropically etching the first semiconductor layer and the vertical insulating layer to expose the semiconductor substrate 200. The vertical insulating patterns 230 and the first semiconductor patterns 240 may be formed to have a hollow cylindrical shape. The vertical insulating layer may include a plurality of thin films, which may be formed by, for example, CVD or ALD processes.

The vertical insulating layer may include a charge storing layer, which may serve as a memory element of FLASH memory devices. The charge storing layer may be a trap insulating layer or an insulating layer with conductive nanodots. In example embodiments, the vertical insulating layer may include at least one layer (not shown) exhibiting a phase-changeable or variable resistance property.

In example embodiments, although not shown, the vertical insulating layer may include a blocking insulating layer, a charge storing layer, and a tunnel insulating layer, which are sequentially stacked on the inner surfaces of the channel holes CH. The blocking insulating layer may be formed to cover sidewalls of the sacrificial layers HL and the insulating layers ILD exposed by the channel holes CH and the top surface of the semiconductor substrate 200. The blocking insulating layer may be formed of, for example, a silicon oxide layer and/or an aluminum oxide layer. The charge storing layer may include a trap insulating layer or an insulating layer with conductive nanodots. For example, the charge storing layer may include at least one of a silicon nitride layer, a silicon oxynitride layer, a silicon-rich nitride layer, a nanocrystalline silicon layer, or a laminated trap layer. The tunnel insulating layer may be formed of at least one of insulating layers, whose band gaps are greater than that of the charge storing layer. For example, the tunnel insulating layer may be a silicon oxide layer.

The first semiconductor layer may be formed on the vertical insulating layer. In example embodiments, the first semiconductor layer may be formed of a semiconductor material (e.g., poly silicon, single crystalline silicon, or amorphous silicon), which may be formed using one of atomic layer deposition (ALD) and chemical vapor deposition (CVD) techniques. The top surface of the semiconductor substrate 200 may be over-etched or recessed, during anisotropically etching the first semiconductor layer and the vertical insulating layer.

The second semiconductor patterns 245 and gap-filling insulating patterns 250 may be formed in the channel holes CH. In example embodiments, the formation of the second semiconductor patterns 245 and the gap-filling insulating patterns 250 may include sequentially forming a second semiconductor layer and an insulating filling layer in the channel holes CH and planarizing the second semiconductor layer and the insulating filling layer to expose the top surface of the layered structure TS. The second semiconductor layer may be conformally formed to have enough thickness to limit and/or prevent the channel holes CH from being filled with the second semiconductor layer. The second semiconductor layer may be a semiconductor layer (e.g., a polysilicon layer, a single-crystalline silicon layer, or an amorphous silicon layer), which may be formed by one of an atomic layer deposition (ALD) or a chemical vapor deposition (CVD). The insulating filling layer may be formed to completely fill the channel holes CH. As an example, the insulating filling layer may be one of insulating layers and a silicon oxide layer, which may be formed using a spin-on-glass (SOG) technique. According to example embodiments of inventive concepts, the formation of the vertical insulating layer and the first and second semiconductor layers may include performing the substrate treating process using the dummy wafers DW. Here, the pattern structures of the dummy wafers DW may include a plurality of openings 110, each of which is formed to have a similar shape as that of the channel holes CH. Accordingly, it is possible to easily form the dummy wafers DW, whose surface area is similar to that of the semiconductor substrate 200 provided with the channel holes CH.

Next, conductive pads 260 may be formed to be in contact with the first semiconductor patterns 240 and the second semiconductor patterns 245. The formation of the conductive pads 260 may include recessing upper portions of the first and second semiconductor patterns 240 and 245 and filling the recessed regions with a conductive material. Alternatively, the conductive pads 260 may be formed by, for example, doping the first and second semiconductor patterns 240 and 245 to have a conductivity type different from the first and second semiconductor patterns 240 and 245. Although not illustrated, the conductive pads 260 may be formed after forming a device isolation pattern 290, which will be described with reference to FIG. 17.

Figure 16:
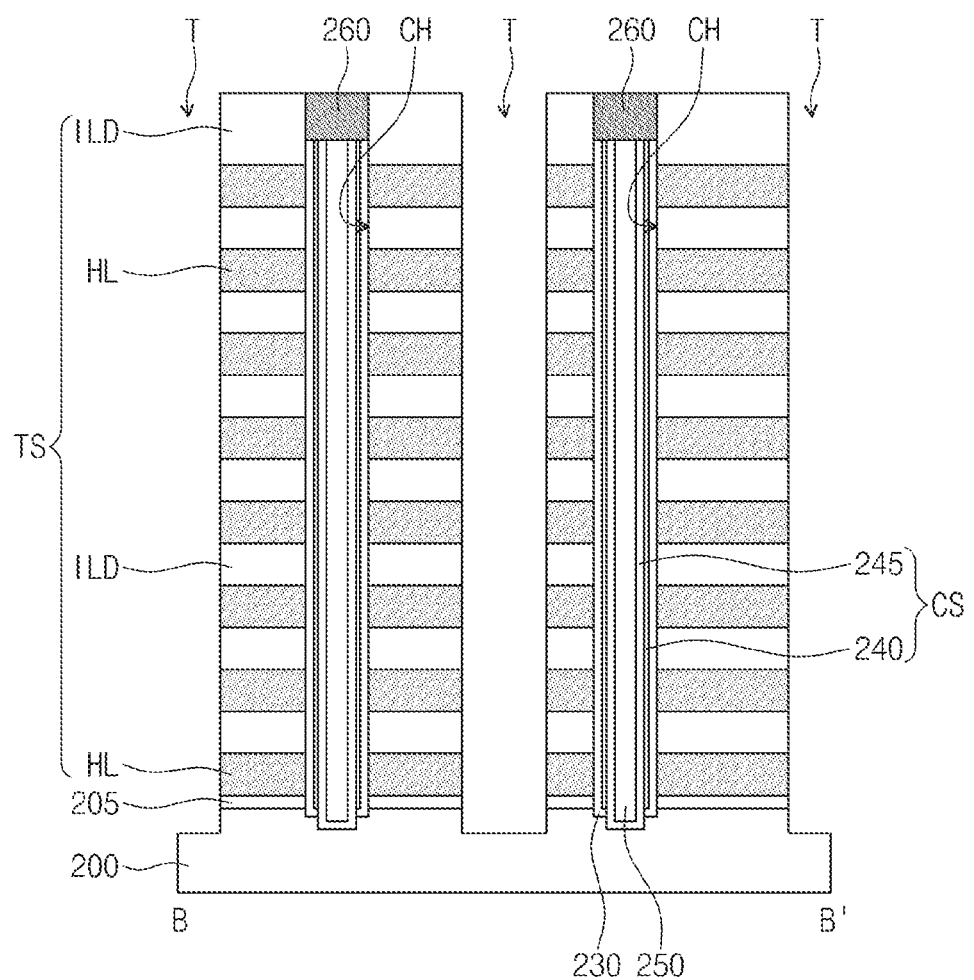

Referring to FIG. 16, the layered structure TS may be patterned to form device isolation trenches T exposing the semiconductor substrate 200. The device isolation trenches T may be formed spaced apart from the channel holes CH.

The formation of the device isolation trenches T may include forming mask patterns (not shown) on the layered structure TS and performing an etching process using them as an etch mask. The device isolation trenches T may be formed to expose sidewalls of the sacrificial and insulating layers HL and ILD. Each of the device isolation trenches T may be a line-shaped structure extending parallel to the first direction D1 in a plan view and may be formed to expose the top surface of the semiconductor substrate 200 in a vertical view. Furthermore, even though the anisotropic etching process is used, the device isolation trenches T may be formed to have a varying width in a direction normal to the top surface of the semiconductor substrate 200.

Figure 17:
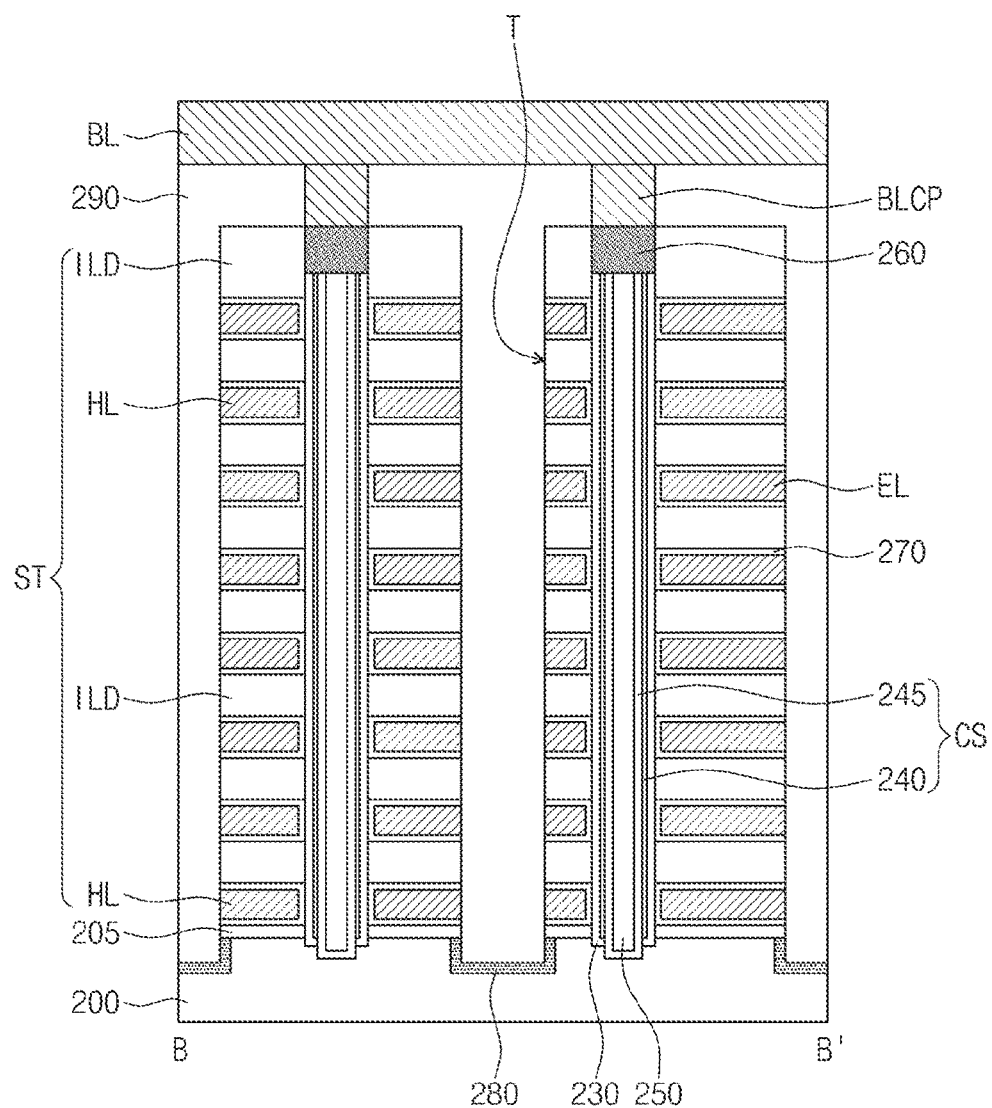

Referring to FIG. 17, the sacrificial layers HL may be replaced with gate electrodes EL. In other words, the sacrificial layers HL exposed by the device isolation trenches T may be selectively removed to form recess regions, and the gate electrodes EL may be formed in the recess regions. The recess regions may be gap regions laterally extending from the device isolation trenches T. The recess regions may be formed between the insulating layers ILD to expose sidewalls of the vertical insulating patterns 230. In example embodiments, before the formation of the gate electrodes EL, horizontal insulating patterns 270 may be formed to partially fill the recess regions. The horizontal insulating patterns 270 may be formed to cover inner surfaces of the recess regions.

In example embodiments, the formation of the horizontal insulating patterns 270 and the gate electrodes EL may include sequentially forming a horizontal layer and a gate layer (e.g., a metal layer) to fill the recess regions and removing the horizontal layer and the gate layer from the device isolation trenches T. Each of the horizontal insulating patterns 270 may be formed to have a single- or multi-layered structure, similar to the vertical insulating patterns 230. In example embodiments, the horizontal insulating patterns 270 may include a blocking dielectric layer of a charge-trap type nonvolatile memory transistor. According to example embodiments of inventive concepts, the formation of the horizontal layer may include performing the substrate treating process using the dummy wafers DW. Here, the pattern structures of the dummy wafers DW may include a plurality of openings 110, each of which is formed to have a similar shape as that of the device isolation trenches T. Accordingly, it is possible to easily form the dummy wafers DW, whose surface area is similar to that of the semiconductor substrate 200 provided with the device isolation trenches T.

After the formation of the gate electrodes EL, common source regions 280 may be formed in the semiconductor substrate 200. The common source regions 280 may be formed, in the semiconductor substrate 200 exposed by the device isolation trenches T, by an ion implantation process. Thereafter, a device isolation pattern 290 may be formed on the common source regions 280 to fill the device isolation trenches T. The device isolation pattern 290 may be formed of at least one of a silicon oxide layer, a silicon nitride layer, or a silicon oxynitride layer.

Thereafter, contact plugs BLCP may be formed to be connected to the conductive pads 260, and a bit line BL may be formed to be connected to the contact plugs BLCP. The bit line BL may be electrically connected to the first semiconductor patterns 240 and the second semiconductor patterns 245 through the contact plugs BLCP.

In example embodiments, the semiconductor device formed by the method including FIGS. 13 through 17 may be a nonvolatile memory. The nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As described above, in the case where thin films of a semiconductor device are formed using the thin-film forming method using the dummy wafers according to example embodiments of inventive concepts, the thin films can be formed to have improved thickness uniformity. Accordingly, the semiconductor device can have improved reliability. Although a three-dimensional nonvolatile memory device has been described as an example of a semiconductor device, which can be fabricated by a fabrication method using the dummy wafers according to example embodiments of inventive concepts, but inventive concepts are not limited thereto. For example, the fabrication method using the dummy wafers may be applied to fabricate other memory devices (e.g., DRAM device) or non-memory devices (e.g., logic devices).

According to example embodiments of inventive concepts, a substrate including an insulating material is used as a dummy wafer, and thus, it is possible to easily perform a patterning process for increasing a surface area and thereby to fabricate the dummy wafer with low cost. In addition, a cleaning process for reusing the dummy wafer can be performed using a thin-film forming system, and thus, it is possible to reduce cost for cleaning the dummy wafer. As a result, it is possible to reduce cost for fabricating and managing the dummy wafer, and thus, the dummy wafer can be applied to mass production of a semiconductor device.

Furthermore, the use of the dummy wafer makes it possible to improve uniformity in thickness of thin films formed on product wafers and consequently to improve reliability of semiconductor device.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While example embodiments of the inventive concepts have been particularly shown and described, it will be understood by one of ordinary skill in the art that variations in form and detail may be made therein without departing from the spirit and scope of the attached claims.

What is claimed is:

1. A dummy wafer, comprising:
an insulating substrate including a first surface opposite a second surface
the insulating substrate including a plurality of openings formed in the insulating substrate,
the plurality of openings penetrating at least a portion of the insulating substrate in a direction from the first surface toward the second surface,
the first surface and the second surface of the insulating substrate, and an inner surface of each of the plurality of openings, including protrusions,
the protrusions of the inner surface of the plurality of opening protruding from a sidewall of the plurality of openings.

2. The dummy wafer of claim 1, wherein
the protrusions are island-shape structures, and
the protrusions are formed in an irregular manner.

3. The dummy wafer of claim 1, wherein the plurality of openings have a hole shape.

4. The dummy wafer of claim 3, wherein the plurality of openings are arranged along first and second directions crossing each other such that the plurality of openings are arranged in rows and columns.

5. The dummy wafer of claim 4, wherein
the plurality of openings include a first column of openings and a second column of openings,
the first and second columns of openings are arranged in the second direction, and
the second column of openings is adjacent to the first column of openings, and
the openings in the first and second columns are arranged in a zigzag arrangement.

6. The dummy wafer of claim 3, wherein the plurality of openings have a diameter ranging from 0.3 mm to 1 mm.

7. The dummy wafer of claim 3, wherein the plurality of openings are open holes that penetrate the insulating substrate from the first surface to the second surface.

8. The dummy wafer of claim 1, wherein the plurality of openings have a trench shape.

9. The dummy wafer of claim 8, wherein the plurality of openings extend in a first direction and are spaced apart from each other in a second direction crossing the first direction.

10. The dummy wafer of claim 8, wherein
the plurality of openings include first openings and second openings,
the first openings extend in a first direction and are spaced apart from each other in a second direction crossing the first direction,
the second openings extend in the second direction and are spaced apart from each
other in the first direction, and
the first openings and the second openings intersect with each other.

11. The dummy wafer of claim 8, wherein
the plurality of openings have a width ranging from 0.3 mm to 5 mm, and
the plurality of openings have a depth that is greater than 0.3 mm and is smaller than half a thickness of the insulating substrate.

12. The dummy wafer of claim 11, wherein the thickness of the insulating substrate ranges from 1 mm to 5 mm.

13. The dummy wafer of claim 1, wherein the insulating substrate includes quartz.

14. The dummy wafer of claim 1, wherein the first surface and the second surface are parallel to each other.

15. The dummy wafer of claim 1, wherein the protrusions along the inner surface of the plurality of openings include concave portions and convex portions.

* * * * *